(12) United States Patent
Knutrud

(10) Patent No.: US 10,445,889 B2
(45) Date of Patent: Oct. 15, 2019

(54) METHOD FOR MEASURING OVERLAY OFFSET IN AN INTEGRATED CIRCUIT AND RELATED TECHNOLOGY

(71) Applicant: Inspectrology LLC, Sudbury, MA (US)

(72) Inventor: Paul Knutrud, Bolton, MA (US)

(73) Assignee: Inspectrology LLC, Sudbury, MA (US)

( * ) Notice: Subject to any disclaimer, the term of this patent is extended or adjusted under 35 U.S.C. 154(b) by 268 days.

(21) Appl. No.: 15/618,027

(22) Filed: Jun. 8, 2017

(65) Prior Publication Data
US 2018/0357754 A1 Dec. 13, 2018

(51) Int. Cl.
| | | |
|---|---|---|
| *G06T 7/33* | (2017.01) | |
| *G06T 7/13* | (2017.01) | |
| *H01L 23/544* | (2006.01) | |
| *G03F 7/20* | (2006.01) | |
| *G06T 7/00* | (2017.01) | |

(52) U.S. Cl.
CPC ............ *G06T 7/33* (2017.01); *G03F 7/70633* (2013.01); *G06T 7/0004* (2013.01); *G06T 7/13* (2017.01); *G06T 7/337* (2017.01); *H01L 23/544* (2013.01); *G06T 2207/10056* (2013.01); *G06T 2207/30148* (2013.01); *G06T 2207/30204* (2013.01); *H01L 2223/54453* (2013.01)

(58) Field of Classification Search
None
See application file for complete search history.

(56) References Cited

U.S. PATENT DOCUMENTS

| | | | | |
|---|---|---|---|---|
| 5,737,441 | A * | 4/1998 | Nishi | G06K 9/3216 347/3 |
| 6,077,756 | A * | 6/2000 | Lin | H01L 22/34 257/797 |
| 6,612,159 | B1 * | 9/2003 | Knutrud | G03F 7/70633 73/105 |
| 9,182,680 | B2 | 11/2015 | Ghinovker | |
| 9,754,895 | B1 * | 9/2017 | Chao | H01L 23/544 |
| 2003/0223630 | A1 * | 12/2003 | Adel | G03F 7/705 382/145 |
| 2005/0122516 | A1 * | 6/2005 | Sezginer | G03F 7/70633 356/401 |
| 2006/0172447 | A1 * | 8/2006 | Do | G03F 7/70625 438/27 |

(Continued)

*Primary Examiner* — Kim Y Vu
*Assistant Examiner* — Nathan J Bloom
(74) *Attorney, Agent, or Firm* — Perkins Coie LLP

(57) ABSTRACT

A metrology method in accordance with at least some embodiments of the present technology includes receiving images of first and second alignment elements of an integrated circuit. The first and second alignment elements are, respectively, at a first level and an overlying second level of the integrated circuit. The method also includes analyzing the images to determine respective blended approximate centerpoints of the first and second alignment elements. For each of the first and second alignment elements, this analysis is based, at least partially, on two or more different 90-degree rotational symmetries. The method further includes determining an overlay offset of the second level relative to the first level based, at least partially, a difference between the blended approximate centerpoint of the first alignment element and the blended approximate centerpoint of the second alignment element.

19 Claims, 3 Drawing Sheets

(56) References Cited

U.S. PATENT DOCUMENTS

| | | | |
|---|---|---|---|
| 2007/0058169 A1* | 3/2007 | Ausschnitt | G03F 7/70633 356/401 |
| 2013/0107259 A1* | 5/2013 | Choi | G03F 7/70683 356/401 |
| 2015/0204664 A1* | 7/2015 | Bringoltz | G03F 7/70683 356/492 |
| 2016/0313116 A1 | 10/2016 | Ghinovker et al. | |
| 2019/0049858 A1* | 2/2019 | Gurevich | G03F 7/70633 |

* cited by examiner

METHOD FOR MEASURING OVERLAY OFFSET IN AN INTEGRATED CIRCUIT AND RELATED TECHNOLOGY

BACKGROUND

The processes used to manufacture modern integrated circuits often involve precise alignment to ensure that newly formed features are correctly positioned relative to previously formed features. The accuracy of this alignment may depend on the sometimes imprecise operation of manufacturing tools, such as photolithography steppers, and on other manufacturing conditions with potential for variability. In practice, if a photolithography tool fails to achieve an alignment within an acceptable tolerance, or if some other alignment error occurs in an in-process integrated circuit, it is useful to detect this error as quickly as possible. For example, in the context of a photolithography process in which a layer of photoresist is exposed to light to form a pattern for subsequently deposited material, if an error in the alignment of this pattern is detected before subsequent processing, the patterned photoresist can often be removed and the photolithography process repeated to correct the error. If the error is not detected, the placement of the subsequently deposited material will likely be incorrect and the wafer carrying the in-process integrated circuit may need to be scrapped as a result.

Overlay metrology can be used to ensure accurate alignment of features as integrated circuits are manufactured. In a conventional approach to overlay metrology, alignment elements are formed at overlapping levels of an integrated circuit by photolithography along with features of electrical components of the integrated circuit. The positions of the alignment features are detected by a microscope and compared from one level to another. A vector difference in the position of a given alignment element at one level and a counterpart alignment element at another level can be used to determine an overlay offset between the levels. If an overlay offset measured in this manner is too high, an alignment error has likely occurred. The source of the error can then be identified and corrected, and the affected wafer, batch of wafers, production run, etc. can be reworked as needed. As integrated circuits have become increasingly dense, alignment tolerances have become tighter and alignment errors have become more difficult to avoid. Accordingly, liberal use of overlay metrology is often warranted in conjunction with processes used to manufacture modern integrated circuits. With this in mind, there is a continuing need for improvement in the field of overlay metrology.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology. For ease of reference, throughout this disclosure identical reference numbers may be used to identify identical, similar, or analogous components or features of more than one embodiment of the present technology.

DETAILED DESCRIPTION

Figure 1:
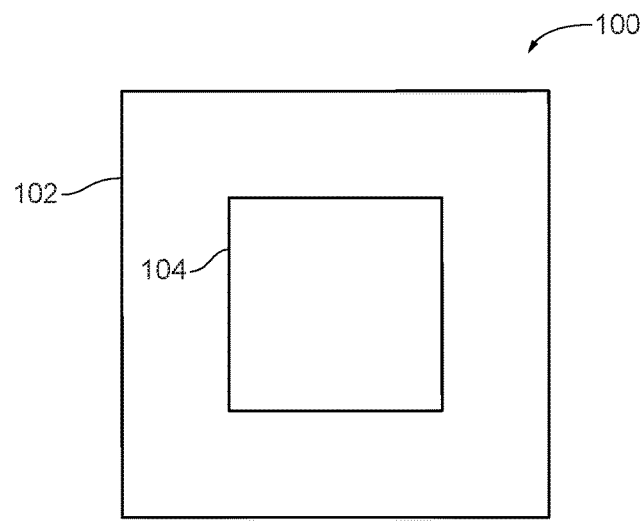
FIG. 1 is a top plan view of a conventional box-in-box test pattern.

Metrology methods and related devices, systems, and methods in accordance with embodiments of the present technology can at least partially address one or more problems associated with conventional technologies whether or not such problems are stated herein. For example, a metrology method in accordance with at least some embodiments of the present technology includes innovative features that allow alignment elements of in-process integrated circuits to be located with improved accuracy. In at least some cases, the metrology method includes locating an alignment element based, at least partially, on two or more different 90-degree rotational symmetries of the alignment element. For example, while a conventional metrology method may locate an alignment element based on top-to-bottom and side-to-side symmetry of an alignment element in a given reference plane, a metrology method in accordance with at least some embodiments of the present technology may also locate the alignment element based on top-to-bottom and side-to-side symmetry of the alignment element in a reference plane rotationally offset from the given reference plane. The rotational offset can be, for example, 45, 135, 225 or 315 degrees when the alignment element has two 90-degree rotational symmetries, or 30, 90, 150, 210, 270 or 330 degrees when the alignment element has three 90-degree rotational symmetries. Information from analysis of the alignment element in the additional reference plane can improve the accuracy of the alignment-element location, and, therefore, the accuracy of the overlay offset determined based on the alignment-element location. In contrast to conventional metrology methods, metrology methods in accordance with embodiments of the present technology can be more accurate, more reliable, and/or have other significant advantages.

Specific details of metrology methods and related devices and systems in accordance with several embodiments of the present technology are described herein with reference to FIGS. 1-5. Although the metrology methods and related devices and systems may be disclosed herein primarily or entirely in the context of in-line overlay monitoring, other contexts in addition to those disclosed herein are within the scope of the present technology. For example, features of described metrology methods and related devices and systems can be implemented in the context of equipment calibration, equipment characterization, and process replication, among other examples. Furthermore, it should be understood, in general, that other methods, devices, and systems in addition to those disclosed herein are within the scope of the present technology. For example, methods, devices, and systems in accordance with embodiments of the present technology can have different and/or additional configurations, components, and procedures than those disclosed herein. Moreover, a person of ordinary skill in the art will understand that methods, devices, and systems in accordance with embodiments of the present technology can be without one or more of the configurations, components, and/or procedures disclosed herein without deviating from the present technology.

FIG. 1 is a top plan view of a conventional box-in-box test pattern 100. The box-in-box test pattern 100 will be used throughout this disclosure to illustrate aspects of the present technology. It should be understood, however, that the box-in-box test pattern 100 is one of many different test patterns compatible with metrology methods and related devices and systems in accordance with embodiments of the present technology. For example, metrology methods and related devices and systems in accordance with at least some embodiments of the present technology can be used with frame-in-frame test patterns and with bar-in-bar test patterns, among others. With reference to FIG. 1, the box-in-box test pattern 100 can be in accordance with Standard P28-96 (Semiconductor Equipment and Materials International, 1996), which is incorporated herein by reference in its entirety. To these extent this document or any other document incorporated herein by reference conflicts with the present disclosure, the present disclosure controls. The box-in-box test pattern 100 can include a first alignment element 102 and a second alignment element 104 in a nested configuration with the second alignment element 104 within a perimeter of the first alignment element 102 when viewed from above. In an integrated circuit (not shown) carrying the box-in-box test pattern 100, the first alignment element 102 can be at a first level, and the second alignment element 104 can be at a second level overlying the first level. For example, the first alignment element 102 can be a pillar of polysilicon, and the second alignment element 104 can be a pillar of photoresist overlying the pillar of polysilicon. As described below, the box-in-box test pattern 100 can be used to measure overlay offset of the second level relative to the first level.

Figure 2:
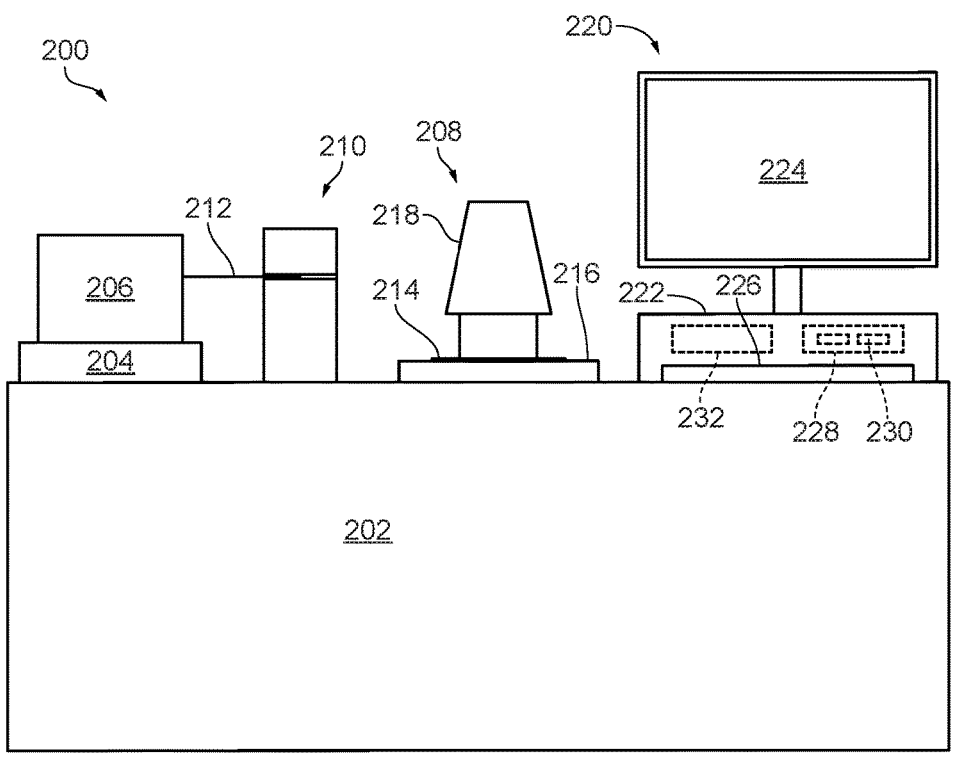
FIG. 2 is a front elevational view of a metrology system in accordance with at least some embodiments of the present technology.

FIG. 2 is a front elevational view of a metrology system 200 in accordance with at least some embodiments of the present technology. The metrology system 200 includes a base 202 carrying a dock 204 configured to receive a wafer cassette 206. The metrology system 200 further includes a microscope station 208 carried by the base 202, and a robotic wafer handler 210 carried by the base 202 between the dock 204 and the microscope station 208. The robotic wafer handler 210 includes a vacuum wand 212 configured to releasably capture a wafer 214, and to transfer the wafer 214 from the wafer cassette 206 to the microscope station 208. The microscope station 208 includes a plate 216 configured to support the wafer 214, and a microscope 218 (e.g., an optical microscope) configured to capture images of the wafer 214. In particular, the microscope 218 is configured to capture magnified images of the first and second alignment elements 102, 104.

The metrology system 200 also includes a computer 220 having a housing 222 and various peripherals, such as a monitor 224 and a keyboard 226. Within the housing 222, the computer 220 includes memory 228 having storage modules 230 storing instructions related to operation of the metrology system 200. Also within the housing 222, the computer 220 includes a processor 232 operably coupled to the microscope 218 and to the storage modules 230. The metrology system 200 and its counterparts can be independent systems for measuring overlay offset or components of distributed systems for this purpose. For example, the computer 220 and its counterparts can be single local or remote machines or networks of local and/or remote machines. Similarly, the memory 228 and the processor 232 and their counterparts can be at least partially distributed within a network of local and/or remote machines.

Figure 3:
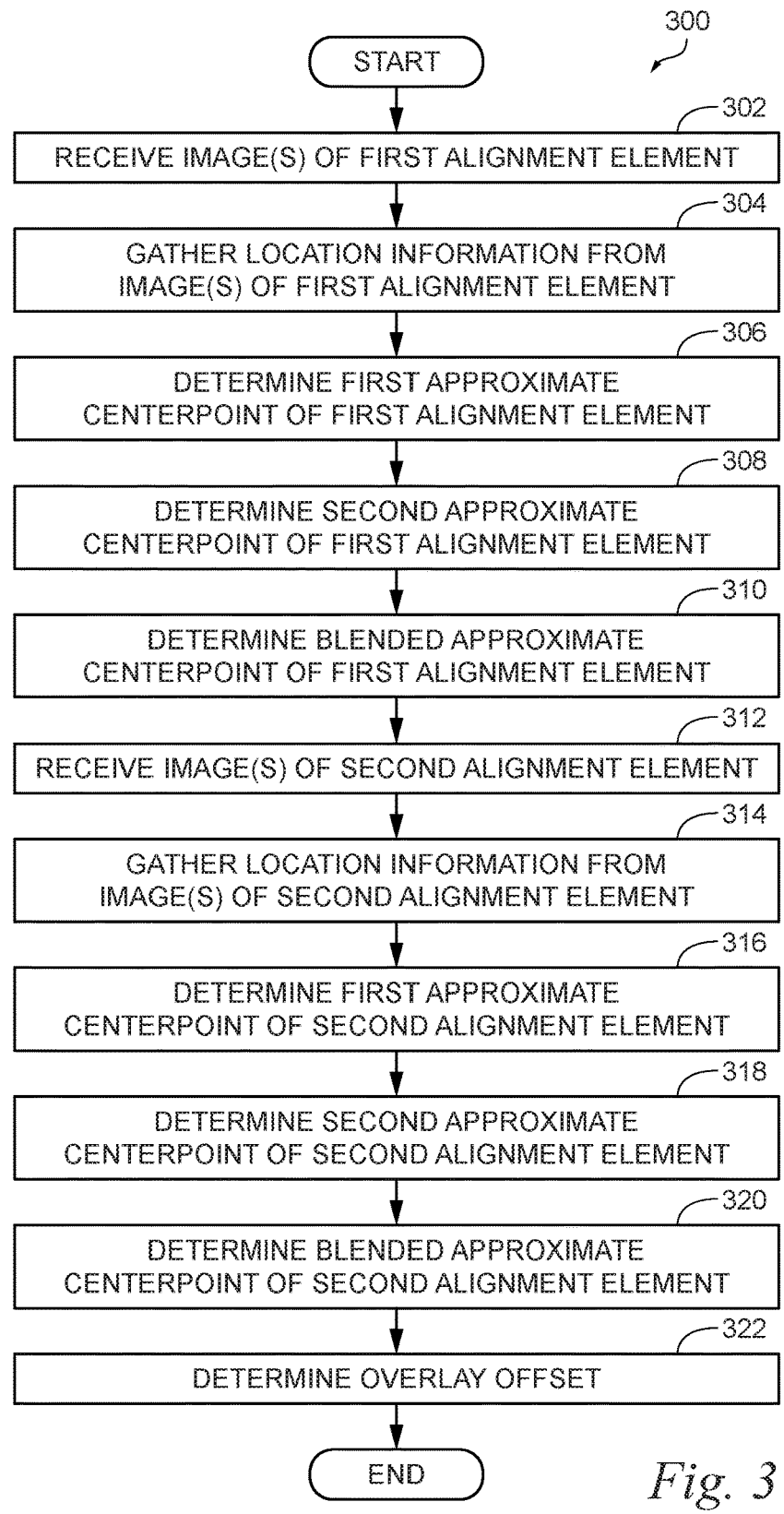
FIG. 3 is a flow chart illustrating a metrology method in accordance with at least some embodiments of the present technology.
Figure 4:
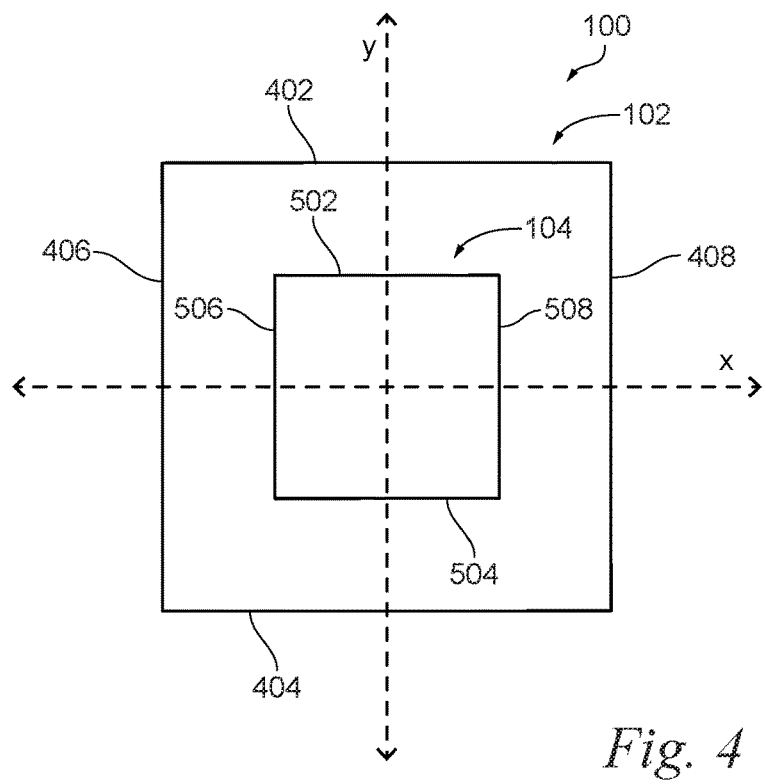
FIG. 4 is a top plan view of the box-in-box test pattern of FIG. 1 and a first reference plane during a portion of the method of FIG. 3.
Figure 5:
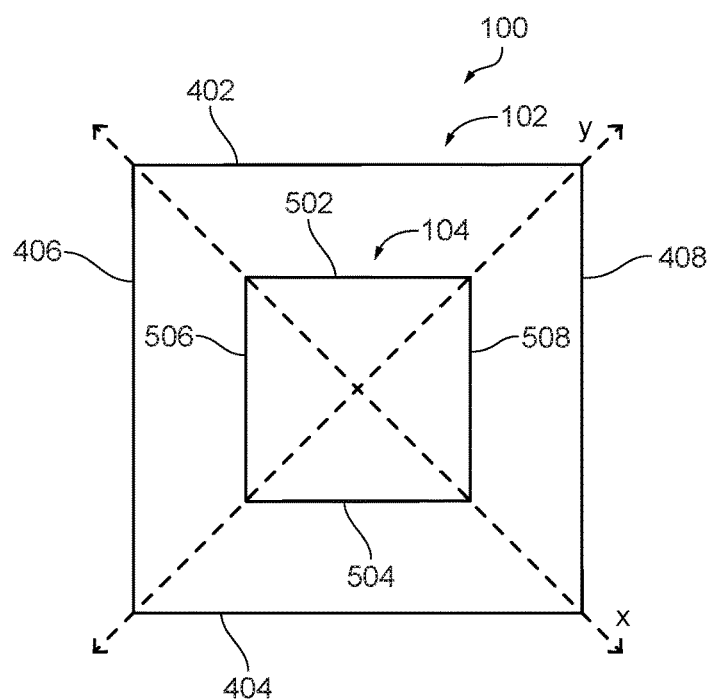
FIG. 5 is a top plan view of the box-in-box test pattern of FIG. 1 and a second reference plane during a portion of the method of FIG. 3.

FIG. 3 is a flow chart illustrating a metrology method 300 in accordance with at least some embodiments of the present technology. FIGS. 4 and 5 are top plan views of the box-in-box test pattern 100 and a first reference plane (FIG. 4) and a second reference plane (FIG. 5) during respective portions of the method 300. With reference to FIGS. 2-5 together, the method 300, at a high level, includes determining approximate centerpoints of the first and second alignment elements 102, 104, respectively, and then determining an overlay offset based on a difference between these approximate centerpoints. At least some operations of the method 300 are performed at the computer 220. For example, the storage modules 230 can store non-transitory instructions for carrying out at least some operations of the method 300.

As shown in FIG. 3, the method 300 includes first receiving one or more images of the first alignment element 102 from the microscope 218 (block 302). The method 300 further includes gathering location information corresponding to edges of the first alignment element 102 from at least one of the one or more images of the first alignment element 102 (block 304). For example, this can include applying a Canny or other suitable edge detector to the one or more images of the first alignment element 102. The result of this process is, in at least some cases, digitized location information corresponding to edges of the first alignment element 102. The correspondence of this location information to the actual alignment of the integrated-circuit level including the first alignment element 102 may be limited, however, due to imprecision in the manufacturing process by which the first alignment element 102 is formed, imprecision in the imaging process, imprecision in the edge-detection process, and/or for other reasons. As discussed below, the method 300 can at least partially mitigate the impact of this imperfect correlation by locating the first alignment element 102 based, at least partially, on both of its 90-degree rotational symmetries.

With reference to FIGS. 4 and 5, each of the first and second alignment elements 102, 104 has a 90-degree rotational symmetry in the first reference plane and another 90-degree rotational symmetry in the second reference plane. In particular, the first and second alignment elements 102, 104 are each symmetrical about the x-axis and symmetrical about the y-axis of the first reference plane (first 90-degree rotational symmetry) and symmetrical about the x-axis and symmetrical about the y-axis of the second reference plane (second 90-degree rotational symmetry). Unlike conventional methods that locate an alignment element based on only one 90-degree rotational symmetry, the method 300 locates the first and second alignment elements 102, 104 based on both their first and second 90-degree rotational symmetries.

As shown in FIG. 4, the first alignment element 102 includes a first edge 402 and a second edge 404 symmetrically disposed about the x-axis of the first reference plane. The first alignment element 102 also includes a third edge 406 and a fourth edge 408 symmetrically disposed about the y-axis of the first reference plane. Similarly, the second alignment element 104 includes a first edge 502 and a second edge 504 symmetrically disposed about the x-axis of the first reference plane, as well as a third edge 506 and a fourth edge 508 symmetrically disposed about the y-axis of the first reference plane. In the illustrated case, the first and second edges 402, 404 of the first alignment element 102 and the first and second edges 502, 504 of the second alignment element 104 are parallel to the x-axis of the first reference plane. Also in illustrated case, the third and fourth edges 406, 408 of the first alignment element 102 and the third and fourth edges 506, 508 of the second alignment element 104 are parallel to the y-axis of the first reference plane. In other cases, the edges of the first and second alignment elements 102, 104 can have other suitable arrangements. For example, the edges of the first and second alignment elements 102, 104 can be portions of a more complex shape with more than two 90-degree rotational symmetries.

The method 300 includes determining a first approximate centerpoint of the first alignment element 102 based, at least partially, on a 90-degree rotational symmetry of the first alignment element 102 in the first reference plane (block 306). A y-coordinate of the first approximate centerpoint can be determined by averaging location information corresponding to one or more edges (e.g., the first edge 402) of the first alignment element 102 at one side of the x-axis of the first reference plane with location information corresponding to one or more of the edges (e.g., the second edge 404) of the first alignment element 102 at an opposite side of the x-axis of the first reference plane. Similarly, an x-coordinate of the first approximate centerpoint can be determined by averaging location information corresponding to one or more edges (e.g., the third edge 406) of the first alignment element 102 at one side of the y-axis of the first reference plane with location information corresponding to one or more of the edges (e.g., the fourth edge 408) of the first alignment element 102 at an opposite side of the y-axis of the first reference plane. The averaging used to determine the y-coordinate and the x-coordinate can be in accordance with any suitable statistical method in the field of image processing.

Using the first approximate centerpoint as the only representation of the location of the first alignment element 102 in determining overlay offset can be suboptimal. Instead, the method 300 includes further determining a second approximate centerpoint of the first alignment element 102 based, at least partially, on a different 90-degree rotational symmetry of the first alignment element 102 (block 308). With reference to FIGS. 3-5, the additional 90-degree rotational symmetry of the first alignment element 102 can be in the second reference plane. In the illustrated case, the second reference plane is rotationally offset from the first reference plane by 45 degrees. In other cases, the second reference plane can be rotationally offset from the first reference plane by another suitable angle. For example, the second reference plane can be rotationally offset from the first reference plane by 135, 225 or 315 degrees when an alignment element has two 90-degree rotational symmetries or by 30, 90, 150, 210, 270 or 330 degrees when an alignment element has three 90-degree rotational symmetries.

As with determining the first approximate centerpoint of the first alignment element 102, determining second approximate centerpoint of the first alignment element 102 can include averaging location information to determine a y-coordinate and an x-coordinate of the second approximate centerpoint. The y-coordinate of the second approximate centerpoint can be determined by averaging location information corresponding to one or more edges (e.g., the first and fourth edges 402, 408) of the first alignment element 102 at one side of the x-axis of the second reference plane with location information corresponding to one or more edges (e.g., the second and third edges 404, 406) of the first alignment element 102 at an opposite side of the x-axis of the second reference plane. Similarly, an x-coordinate of the second approximate centerpoint can be determined by averaging location information corresponding to one or more edges (e.g., the first and third edges 402, 406) of the first alignment element 102 at one side of the y-axis of the second reference plane with location information corresponding to one or more edges (e.g., the second and fourth edges 404, 408) of the first alignment element 102 at an opposite side of the y-axis of the second reference plane. Again, the averaging used to determine the y-coordinate and the x-coordinate can be in accordance with any suitable statistical method in the field of image processing.

In some cases, the underlying location information corresponding to edges of the first alignment element 102 is the same for determining both the first and second approximate centerpoints. For example, different subsets of the same location information can be averaged to determine the x-coordinates of the first and second approximate centerpoints, respectively, and different subsets of the same location information can be averaged to determine the y-coordinates of the first and second approximate centerpoints, respectively. In other cases, the location information for determining the first approximate centerpoint can be different than the location information for determining the second approximate centerpoint. For example, rather than gathering location information once and then processing the gathered location information to determine both the first and second approximate centerpoints, the method 300 can include gathering first location information for determining the first approximate centerpoint, and separately gathering second location for determining the second approximate centerpoint. The first and second location information can be gathered from the same or different images of the first alignment element 102. For example, the method 300 can include gathering first location information from one or more images of the first alignment element 102, then rotating the one or more images (e.g., by 45, 135, 225 or 315 degrees), and then gathering second location information from the one or more images. Alternatively or in addition, the method 300 can include gathering first location information from one or more images in which the first alignment element 102 is in a first orientation, and then gathering second location information from one or more different images in which the first alignment element 102 is in a second orientation rotationally offset from the first orientation (e.g., by 45, 135, 225 or 315 degrees).

After the first and second approximate centerpoints of the first alignment element 102 have been determined, the method 300 includes determining a blended approximate centerpoint of the first alignment element 102 (block 310) based, at least partially, on these approximate centerpoints. In at least some cases, the blended approximate centerpoint is an average of the first and approximate centerpoints. For example, the blended approximate centerpoint can be a midpoint along a straight line between the first and second approximate centerpoints of the first alignment element 102. By incorporating information from the first and second approximate centerpoints, the blended approximate centerpoint can be based, at least partially, on two or more different rotational symmetries (e.g., two or more different 90-degree rotational symmetries) of the first alignment element 102. Alternatively, determining the blended approximate centerpoint of the first alignment element 102 can be based on the underlying location information directly. Thus, determining the blended approximate centerpoint of the first alignment element 102 can be achieved with or without the intermediate processes of determining the first and second approximate centerpoints of the first alignment element 102.

The method 300 further includes analyzing one or more images of the second alignment element 104 in a similar manner to the manner discussed above for analyzing one or more images of the first alignment element 102. In particular, the method 300 includes receiving one or more images of the second alignment element 104 (block 312), and gathering location information corresponding to edges (e.g., the first, second, third, and fourth edges 502, 504, 506, 508) of the second alignment element 104 from at least one of the one or more images of the second alignment element 104 (block 314). The one or more images of the second alignment element 104 can be the same as or different than the one or more images of the first alignment element 102 analyzed to determine the blended approximate centerpoint of the first alignment element 102. The method 300 further includes determining a first approximate centerpoint of the second alignment element 104 from the gathered location information (block 316), determining a second approximate centerpoint of the second alignment element 104 from the gathered location information (block 318), and determining a blended approximate centerpoint of the second alignment element 104 from the first and second approximate centerpoints of the second alignment element 104 (block 320). Details, variations, and alternatives discussed above in the context of analyzing one or more images of the first alignment element 102 to arrive at the blended approximate centerpoint of the first alignment element 102 also may be applied to analyzing one or more images of the second alignment element 104 to arrive at the blended approximate centerpoint of the second alignment element 104.

In some embodiments, location information corresponding to the first alignment element 102 is processed based, at least partially, on two or more different rotational symmetries of the first alignment element 102, and location information corresponding to the second alignment element 104 is processed based, at least partially, on two or more different rotational symmetries of the second alignment element 104. In other embodiments, location information corresponding to the first alignment element 102 is processed based, at least partially, on two or more different rotational symmetries of the first alignment element 102, and location information corresponding to the second alignment element 104 is processed based, at least partially, on only one rotational symmetry of the second alignment element 104. In still other embodiments, location information corresponding to the first alignment element 102 is processed based, at least partially, on only one rotational symmetry of the first alignment element 102, and location information corresponding to the second alignment element 104 is processed based, at least partially, on two or more different rotational symmetries of the second alignment element 104.

As discussed above, the first alignment element 102 can be at a first level of an integrated circuit, and the second alignment element 104 can be at an overlying second level of the integrated circuit. The method 300 further includes determining an overlay offset of the second level relative to the first level based, at least partially, on the blended approximate centerpoint of the first alignment element 102 and the blended approximate centerpoint of the second alignment element 104 (block 322). This can include determining a vector difference between the blended approximate centerpoint of the first alignment element 102 and the blended approximate centerpoint of the second alignment element 104. Alternatively, determining the overlay offset can include determining the overlay offset based on the first and second approximate centerpoints of the first alignment element 102 and the first and second approximate centerpoints of the second alignment element 104 directly. Thus, determining the overlay offset can be achieved with or without the intermediate processes of determining the blended approximate centerpoints of the first and second alignment elements 102, 104.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown and/or described in detail to avoid unnecessarily obscuring the description of the embodiments of the present technology. Although steps of methods may be presented herein in a particular order, in alternative embodiments the steps may have another suitable order. Similarly, certain aspects of the present technology disclosed in the context of particular embodiments can be combined or eliminated in other embodiments. Furthermore, while advantages associated with certain embodiments may have been disclosed in the context of those embodiments, other embodiments may also exhibit such advantages, and not all embodiments need necessarily exhibit such advantages or other advantages disclosed herein to fall within the scope of the present technology.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising" and the like are used throughout this disclosure to mean including at least the recited feature(s) such that any greater number of the same feature(s) and/or one or more additional types of features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments of the present technology.

I claim:

1. A metrology method in a computing system, the method comprising:
   receiving one or more images of an alignment element of an integrated circuit;
   gathering location information corresponding to edges of the alignment element from at least one of the one or more images;
   averaging location information corresponding to one or more of the edges at one side of an x-axis of a first reference plane with location information corresponding to one or more of the edges at an opposite side of the x-axis of the first reference plane to determine a y-coordinate of a first approximate centerpoint of the alignment element;

averaging location information corresponding to one or more of the edges at one side of a y-axis of the first reference plane with location information corresponding to one or more of the edges at an opposite side of the y-axis of the first reference plane to determine an x-coordinate of the first approximate centerpoint of the alignment element;

averaging location information corresponding to one or more of the edges at one side of an x-axis of a second reference plane rotationally offset from the first reference plane by 45, 135, 225 or 315 degrees with location information corresponding to one or more of the edges at an opposite side of the x-axis of the second reference plane to determine a y-coordinate of a second approximate centerpoint of the alignment element;

averaging location information corresponding to one or more of the edges at one side of a y-axis of the second reference plane with location information corresponding to one or more of the edges at an opposite side of the y-axis of the second reference plane to determine an x-coordinate of the second approximate centerpoint of the alignment element; and determining a blended approximate centerpoint of the alignment element based, at least partially, on the first and second approximate centerpoints of the alignment element.

2. The method of claim 1 wherein:
gathering the location information includes—
  gathering first location information from at least one of the one or more images in which the alignment element is in a first orientation, and
  gathering second location information from at least one of the one or more images in which the alignment element is in a second orientation rotationally offset from the first orientation by 45, 135, 225 or 315 degrees;
averaging location information to determine the x-coordinate and the y-coordinate of the first approximate centerpoint of the alignment element includes averaging the first location information; and
averaging location information to determine the x-coordinate and the y-coordinate of the second approximate centerpoint of the alignment element includes averaging the second location information.

3. The method of claim 2 wherein:
gathering the first location information includes gathering the first location information from a given one of the one or more images;
the method further comprises rotating the given image by 45, 135, 225 or 315 degrees; and
gathering the second location information includes gathering the second location information from the given image after rotating the given image.

4. The method of claim 2 wherein:
the one or more images include—
  a first image of the alignment element in the first orientation, and
  a second image of the alignment element in the second orientation;
gathering the first location information includes gathering the first location information the first image; and
gathering the second location information includes gathering the second location information from the second image.

5. The method of claim 1 wherein:
the location information includes location information corresponding to first, second, third, and fourth edges of the alignment element;
the first and second edges of the alignment element are symmetrically disposed about the x-axis of the first reference plane;
the third and fourth edges of the alignment element are symmetrically disposed about the y-axis of the first reference plane;
averaging location information corresponding to edges at opposite sides of the x-axis of the first reference plane includes averaging location information corresponding to the first edge with location information corresponding to the second edge;
averaging location information corresponding to edges at opposite sides of the y-axis of the first reference plane includes averaging location information corresponding to the third edge with location information corresponding to the fourth edge;
averaging location information corresponding to edges at opposite sides of the x-axis of the second reference plane includes averaging location information corresponding to the first and fourth edges with location information corresponding to the second and third edges; and
averaging location information corresponding to edges at opposite sides of the y-axis of the second reference plane includes averaging location information corresponding to the first and third edges with location information corresponding to the second and fourth edges.

6. The method of claim 5 wherein:
the first and second edges are parallel to the x-axis of the first reference plane; and
the third and fourth edges are parallel to the y-axis of the first reference plane.

7. The method of claim 1 wherein at least one of the one or more images is an optical image.

8. The method of claim 1 wherein gathering the location information includes applying a Canny edge detector to the one or more images.

9. The method of claim 1 wherein:
the alignment element is a first alignment element at a first level of the integrated circuit; and
the method further comprises—
  receiving one or more images of a second alignment element of the integrated circuit, wherein the second alignment element is at a second level of the integrated circuit overlying the first level,
  gathering location information corresponding to edges of the second alignment element from the one or more images of the second alignment element,
  averaging location information corresponding to one or more of the edges of the second alignment element at one side of an x-axis of a third reference plane with location information corresponding to one or more of the edges of the second alignment element at an opposite side of the x-axis of the third reference plane to determine a y-coordinate of a first approximate centerpoint of the second alignment element,
  averaging location information corresponding to one or more of the edges of the second alignment element at one side of a y-axis of a fourth reference plane with location information corresponding to one or more of the edges of the second alignment element at an opposite side of the y-axis of the fourth reference plane to determine an x-coordinate of the first approximate centerpoint of the second alignment element, averaging location information corresponding to one or more of the edges of the second alignment element at one side of an x-axis of a fourth reference plane rotationally offset from the third reference plane by 45, 135, 225 or 315 degrees with location information corresponding to one or more of the edges of the second alignment element at an opposite side of the x-axis of the fourth reference plane to determine a y-coordinate of a second approximate centerpoint of the second alignment element, averaging location information corresponding to one or more of the edges of the second alignment element at one side of a y-axis of the fourth reference plane with location information corresponding to one or more of the edges of the second alignment element at an opposite side of the y-axis of the fourth reference plane to determine an x-coordinate of the second approximate centerpoint of the second alignment element, and determining a blended approximate centerpoint of the second alignment element based, at least partially, on the first and second approximate centerpoints of the second alignment element.

10. The method of claim 9, further comprising determining an overlay offset of the second level relative to the first level based, at least partially, a difference between the blended approximate centerpoint of the first alignment element and the blended approximate centerpoint of the second alignment element.

11. A metrology method in a computing system, the method comprising:

determining a first approximate centerpoint of a first alignment element at a first level of an integrated circuit based, at least partially, on a 90-degree rotational symmetry of the first alignment element in a first reference plane;

determining a second approximate centerpoint of the first alignment element based, at least partially, on a 90-degree rotational symmetry of the first alignment element in a second reference plane rotationally offset from the first reference plane;

determining a first approximate centerpoint of a second alignment element at a second level of the integrated circuit based, at least partially, on a 90-degree rotational symmetry of the second alignment element in a third reference plane, wherein the second level overlies the first level;

determining a second approximate centerpoint of the second alignment element based, at least partially, on a 90-degree rotational symmetry of the second alignment element in a fourth reference plane rotationally offset from the third reference plane; and determining an overlay offset of the second level relative to the first level based, at least partially, on the first and second approximate centerpoints of a first alignment element and the first and second approximate centerpoints of a second alignment element.

12. The method of claim 11 wherein:
the second reference plane is rotationally offset from the first reference plane by 45, 135, 225 or 315 degrees; and
the fourth reference plane is rotationally offset from the third reference plane by 45, 135, 225 or 315 degrees.

13. The method of claim 11 wherein:
the method further comprises—
determining a blended approximate centerpoint of the first alignment element based, at least partially, on the first and second approximate centerpoints of the first alignment element, and
determining a blended approximate centerpoint of the second alignment element based, at least partially, on the first and second approximate centerpoints of the second alignment element; and
determining the overlay offset includes determining the overlay offset based, at least partially, a difference between the blended approximate centerpoint of the first alignment element and the blended approximate centerpoint of the second alignment element.

14. The method of claim 13 wherein:
the method further comprises—
receiving one or more images of the first alignment element, and
gathering location information corresponding to edges of the first alignment element from the one or more images of the first alignment element; and
determining the first and second approximate centerpoints of the first alignment element includes determining the first and second approximate centerpoints of the first alignment element based, at least partially, on the location information from the one or more images of the first alignment element.

15. The method of claim 14 wherein:
the method further comprises—
receiving one or more images of the second alignment element, and
gathering location information corresponding to edges of the second alignment element from the one or more images of the second alignment element; and
determining the first and second approximate centerpoints of the second alignment element includes determining the first and second approximate centerpoints of the second alignment element based, at least partially, on the location information from the one or more images of the second alignment element.

16. A system for measuring overlay in an integrated circuit, the system comprising:

an optical microscope configured to image an alignment element of the integrated circuit;

memory including storage modules storing instructions; and one or more processors operably coupled to the microscope and to the storage modules, wherein the instructions stored on the storage modules include instructions for—
receiving one or more images of the alignment element from the microscope, and
analyzing one or more of the received one or more images to determine a blended approximate centerpoint of the alignment element based, at least partially, on two or more different 90-degree rotational symmetries of the alignment element, the two or more different 90-degree rotational symmetries including a first 90-degree rotational symmetry and a second 90-degree rotational symmetry rotationally offset from the first 90-degree rotational symmetry by 45, 135, 225 or 315 degrees.

17. The system of claim 16 wherein:
the alignment element is a first alignment element at a first level of the integrated circuit; and
the microscope is configured to image a second alignment element of the integrated circuit at a second level of the integrated circuit;
the second level overlies the first level; and
the instructions stored on the storage modules include instructions for—
receiving one or more images of the second alignment element from the microscope, and
analyzing one or more of the received one or more images of the second alignment element to determine a blended approximate centerpoint of the second alignment element based, at least partially, on two or more different 90-degree rotational symmetries of the second alignment element.

18. The system of claim 17 wherein the instructions stored on the storage modules include instructions for determining an overlay offset of the second level relative to the first level based, at least partially, a difference between the blended approximate centerpoint of the first alignment element and the blended approximate centerpoint of the second alignment element.

19. A system for measuring overlay in an integrated circuit, the system comprising:
an optical microscope configured to image an alignment element of the integrated circuit;
memory including storage modules storing instructions; and
one or more processors operably coupled to the microscope and to the storage modules,
wherein the instructions stored on the storage modules include instructions for—
receiving one or more images of the alignment element from the microscope, and
analyzing one or more of the received one or more images to determine a blended approximate centerpoint of the alignment element based, at least partially, on two or more different 90-degree rotational symmetries of the alignment element,
wherein analyzing the one or more images includes:
averaging location information corresponding to one or more edges of the alignment element at one side of an x-axis of a first reference plane with location information corresponding to one or more edges of the alignment element at an opposite side of the x-axis of the first reference plane to determine a y-coordinate of a first approximate centerpoint of the alignment element;
averaging location information corresponding to one or more edges of the alignment element at one side of a y-axis of the first reference plane with location information corresponding to one or more edges of the alignment element at an opposite side of the y-axis of the first reference plane to determine an x-coordinate of the first approximate centerpoint of the alignment element;
averaging location information corresponding to one or more edges of the alignment element at one side of an x-axis of a second reference plane rotationally offset from the first reference plane by 45, 135, 225 or 315 degrees with location information corresponding to one or more edges of the alignment element at an opposite side of the x-axis of the second reference plane to determine a y-coordinate of a second approximate centerpoint of the alignment element;
averaging location information corresponding to one or more edges of the alignment element at one side of a y-axis of the second reference plane with location information corresponding to one or more edges of the alignment element at an opposite side of the y-axis of the second reference plane to determine an x-coordinate of the second approximate centerpoint of the alignment element; and
determining the blended approximate centerpoint of the alignment element based, at least partially, on the first and second approximate centerpoints of the alignment element.

* * * * *